(12) United States Patent
Yu

(10) Patent No.: US 8,395,413 B2
(45) Date of Patent: Mar. 12, 2013

(54) LOGIC CIRCUIT WITHOUT ENHANCEMENT MODE TRANSISTORS

(75) Inventor: Haoyang Yu, Nashua, NH (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 19 days.

(21) Appl. No.: 12/980,264

(22) Filed: Dec. 28, 2010

(65) Prior Publication Data

US 2012/0161812 A1 Jun. 28, 2012

(51) Int. Cl.
*H03K 17/16* (2006.01)
(52) U.S. Cl. ......................................... 326/34
(58) Field of Classification Search ............ 326/68, 326/80–87, 75, 109, 110, 34, 62–63
See application file for complete search history.

(56) References Cited

U.S. PATENT DOCUMENTS

| | | | |
|---|---|---|---|
| 5,229,658 A * | 7/1993 | Ide et al. ........................ | 326/66 |
| 7,619,482 B1 * | 11/2009 | Kobayashi .................... | 330/311 |
| 7,948,305 B2 * | 5/2011 | Shirokov et al. ............... | 327/540 |
| 2005/0206439 A1 | 9/2005 | Struble | |
| 2008/0048719 A1 * | 2/2008 | Ogawa ........................... | 326/63 |

OTHER PUBLICATIONS

Deng, QI, Internet article entitled http://www.eetimes.com/design/industrial-control/4009943/A-primer-on-high-side-FET-load-switches; Mixed Signal Products, Micrel, Inc.; EE Times Network; May 3, 2007.

* cited by examiner

*Primary Examiner* — Thienvu Tran
(74) *Attorney, Agent, or Firm* — Schwabe Williamson & Wyatt

(57) ABSTRACT

Embodiments of circuits, methods and systems for powering various stages of a logic circuit are disclosed. Some embodiments include a circuit having a logic circuit with an input stage and an output stage; a heterojunction bipolar transistor configured to provide a first switched supply voltage to power components of the input stage; and a depletion mode field effect transistor configured to provide a second switched supply voltage to power components of the output stage. Other embodiments may also be described and claimed.

13 Claims, 6 Drawing Sheets

LOGIC CIRCUIT WITHOUT ENHANCEMENT MODE TRANSISTORS

FIELD

Embodiments of the present disclosure relate generally to logic circuits, and more particularly to logic circuits that do not include enhancement mode field effect transistors.

BACKGROUND

In the current state of integrated circuit technology, transistors are typically heavily incorporated into integrated circuits in order to perform a number of functions. In an effort to improve circuit functionality, e.g., for power amplifier circuits, transistors, such as heterojunction bipolar transistors (HBT) and field effect transistors (FET), have been co-integrated on single gallium arsenide substrates.

Co-integrating transistor devices sometimes involves compromising between manufacturability, cost and device performance. For example, for some applications, co-integrating an enhancement mode FET (EFET) with one or more other transistors (e.g., with depletion mode FETs (DFETs), HBTs, etc.) may have a higher cost implication.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in various embodiments" is used repeatedly. The phrase generally does not refer to the same embodiments; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

As used herein, "coupled with" may mean either one or both of the following: a direct coupling or connection, where there is no other element coupled or connected between the elements that are said to be coupled with each other; or an indirect coupling or connection, where one or more other elements are coupled or connected between the elements that are said to be coupled with each other.

Figure 1:
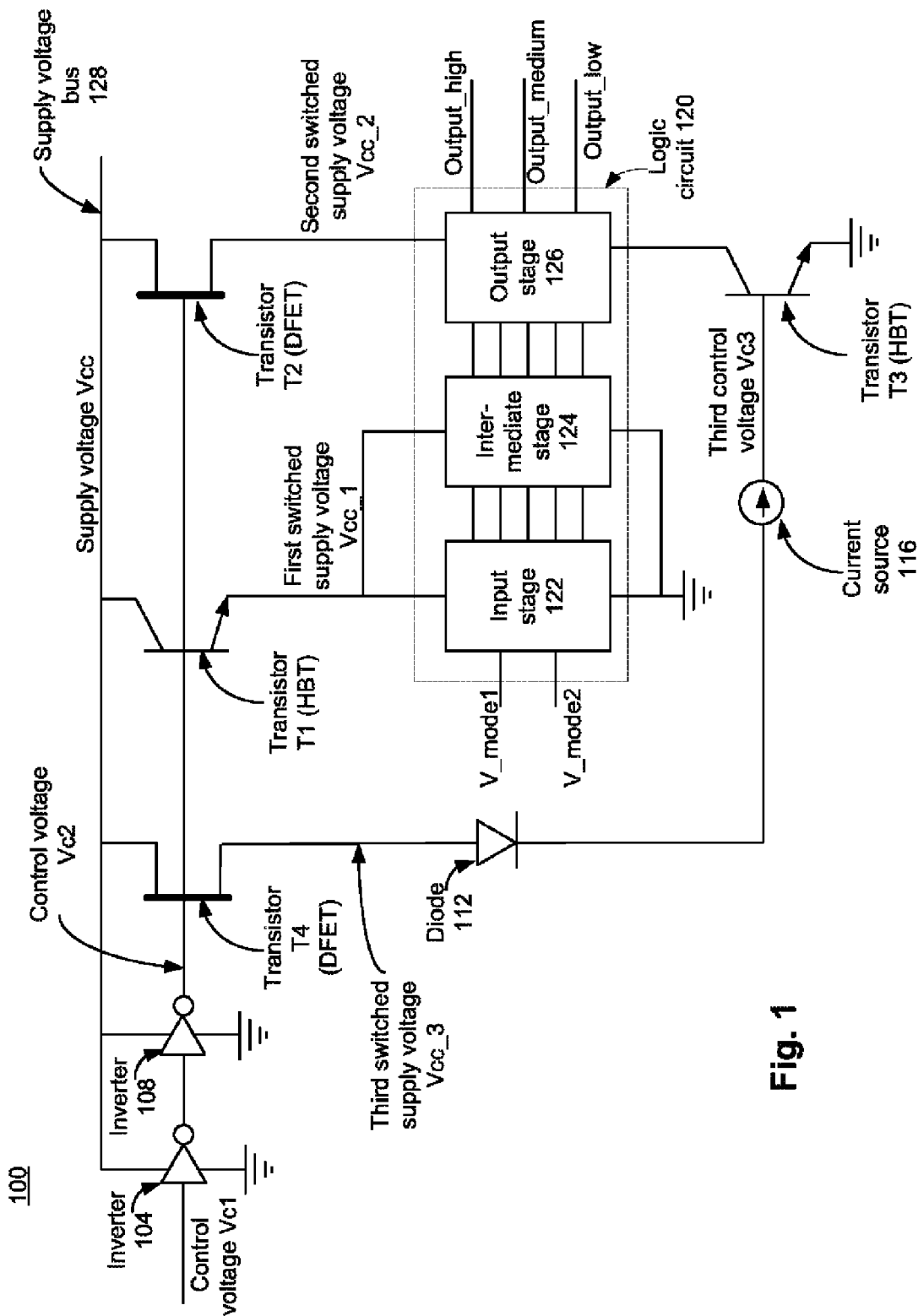
FIGS. 1-4 schematically illustrate circuits in which a first switched supply voltage and a second switched supply voltage are used to power a logic circuit, in accordance with various embodiments.

FIG. 1 schematically illustrates a circuit 100 in which a first switched supply voltage Vcc_1 and a second switched supply voltage Vcc_2 are used to power a logic circuit 120, in accordance with various embodiments.

In various embodiments, the logic circuit 120 may receive one or more mode signals, e.g., V_mode1 and V_mode2, and output one or more output signals, e.g., output_high, output_medium and output_low. In various embodiments, the output signals of the logic circuit 120 may be used to control a power amplifier circuit and/or any other appropriate type of circuit (not illustrated in FIG. 1). For example, when the output_high signal is active and the remaining output signals (i.e., output_medium and output_low) are not active, the power amplifier may operate in a high power mode. Similarly, when the output_medium signal is active and the remaining output signals are not active, the power amplifier may operate in a medium power mode. Also, when the output_low signal is active and the remaining output signals are not active, the power amplifier may operate in a low power mode. When none of the output signals of the logic circuit 120 are active, the power amplifier may be, for example, turned off, enter a standby mode and/or enter a power savings mode. Thus, for example, the output signals of the logic circuit 120 may act as a control signal or mode signal for the power amplifier.

In various embodiments, the output signals of the logic circuit 120 may be based at least in part on the mode signals received by the logic circuit 120 and a control voltage Vc2. For example, when the V_mode1 and V_mode2 are low and high, respectively (e.g., when V_mode1 and V_mode2 represent a logical 0 value and a logical 1 value, respectively), and the control voltage Vc2 is high, the output_high signal may be active and the remaining output signals may not be active. In another example, when the V_mode1 and V_mode2 are high and low, respectively (e.g., representing logical 1 and 0 values, respectively), and the control voltage Vc2 is high, the output_medium signal may be active and the remaining output signals may not be active. In yet another example, when the V_mode1 and V_mode2 are both high, and the control voltage Vc2 is high, the output_low signal may be active and the remaining output signals may not be active. In yet another example, when the V_mode1 and V_mode2 are both low and the control voltage Vc2 is high, none of the output signals of the logic circuit 120 may be active. In another example, when the control voltage Vc2 is low, none of the output signals of the logic circuit 120 may be active.

The above discussed correlations between the mode signals and the output signals of circuit 100 are purely examples, and in various other embodiments, any other appropriate correlation between the mode signals and the output signals may also be possible. Although FIG. 1 illustrates two mode signals and three output signals, in various other embodiments, there may be any different number of mode signals and/or output signals.

In various embodiments, the logic circuit 120 may be segregated in various stages, e.g., an input stage 122, an intermediate stage 124 and an output stage 126. Although not illustrated in FIG. 1, each of the input stage 122, the intermediate stage 124 and the output stage 126 may include a plurality of components (e.g., logic gates, active components, passive components, etc.).

The input stage 122 may receive the mode signals and provide one or more signals to the intermediate stage 124, the intermediate stage 124 may provide one or more signals to the output stage 126, and the output stage 126 may receive the one or more signals from the intermediate stage 124 and output the output signals.

In various embodiments, one or more components of the input stage 122 and one or more components of the intermediate stage 124 may be powered by the first switched voltage Vcc_1, and one or more components of the output stage 126 may be powered by the second switched voltage Vcc_2.

In various embodiments, as the output stage 126 outputs various output signals, including the output_high signal, a desired voltage of the second switched voltage Vcc_2 may be relatively higher than a desired voltage of the first switched voltage Vcc_1. As an example, the second switched voltage Vcc_2 may be at least about 2.9 volts (V), whereas the first switched voltage Vcc_1 may be at least about 1.6 V.

Referring again to FIG. 1, the circuit 100 may include a supply voltage bus 128 configured to receive a supply voltage Vcc. Although not illustrated in FIG. 1, the supply voltage Vcc may be received from any appropriate power source.

In various embodiments, the circuit 100 may include inverter 104 and inverter 108. A terminal of each of the inverter 104 and inverter 108 may be configured to receive the supply voltage Vcc, and another terminal of each of the inverter 104 and inverter 108 may be operatively grounded. The inverter 104 may receive a control voltage Vc1, and the inverter 108 may receive an output of the inverter 104. The inverter 108 may output the control voltage Vc2. As the control voltage Vc1 may be inverted twice to generate the control voltage Vc2, the control voltage Vc2 may have the same logical state as the control voltage Vc1. However, the inverter 104 and the inverter 108 may provide some degree of isolation between the control voltage Vc1 and the control voltage Vc2, e.g., may act as a buffer between the control voltage Vc1 and the control voltage Vc2. Although not illustrated in FIG. 1, in various embodiments, the inverter 104 and the inverter 108 may not be present in the circuit 100. For example, the circuit 100 may directly receive the control voltage Vc2 from any appropriate source.

In various embodiments, the circuit 100 may further include a transistor T1 having a first terminal (e.g., a collector terminal) operatively coupled with the supply voltage bus 128 and configured to receive the supply voltage Vcc, a control terminal (e.g., a base terminal) operatively coupled with the output of the inverter 108 and configured to receive the control voltage Vc2, and a second terminal (e.g., an emitter terminal) operatively coupled with the one or more components of the input stage 122 and configured to provide the first switched supply voltage Vcc_1.

The circuit 100 further may further include a transistor T2 having a first terminal (e.g., a drain terminal) operatively coupled with the supply voltage bus 128 and configured to receive the supply voltage Vcc, a control terminal (e.g., a gate terminal) operatively coupled with the output of the inverter 108 and configured to receive the control voltage Vc2, and a second terminal (e.g., a source terminal) operatively coupled with the one or more components of the output stage 126 and configured to provide the second switched supply voltage Vcc_2.

In various embodiments, one or more components of the output stage 126 may be selectively grounded through a transistor T3. For example, the transistor T3 may include a first terminal (e.g., a collector terminal) configured to be operatively coupled with the one or more components of the output stage 126, a control terminal (e.g., a base terminal) configured to receive a third control voltage Vc3, and a second terminal (e.g., an emitter terminal) configured to be operatively grounded. In various embodiments, the transistor T3 may be an HBT, although in other embodiments, the transistor T3 may be any other appropriate type of transistor.

In various embodiments, unlike the one or more components of the output stage 126, one or more components of the input stage 122 and/or one or more components of the intermediate stage 124 may not be grounded through any transistor. For example, the one or more components of the input stage 122 and/or one or more components of the intermediate stage 124 may be fixedly, i.e., non-selectively, grounded, as illustrated in FIG. 1. In various embodiments, it may be desirable to ground the one or more components of the input stage 122 fixedly, for example, to enable the mode signals to go through a fixed ground.

The circuit 100 may further include a transistor T4 to provide the third control voltage Vc3. The transistor T4 may have a first terminal (e.g., a drain terminal) configured to receive the supply voltage Vcc, a control terminal (e.g., a gate terminal) configured to receive the control voltage Vc2, and a second terminal (e.g., a source terminal) configured to provide a third switched supply voltage Vcc_3. In various embodiments, the transistor T4 may be a DFET, although in other embodiments, the transistor T4 may be any other appropriate type of transistor.

In various embodiments, the third switched supply voltage Vcc_3 may be received by a diode 112, the output of which may be used as an input to a current source 116. The current source 116 may output the third control voltage Vc3.

Although not illustrated in FIG. 1, in various embodiments, the diode 112 may be replaced with any other appropriate component, e.g., a resistor, a voltage level shifter, which shifts a voltage level of the third switched supply voltage Vcc_3, a transistor, and/or the like. In various embodiments, the current source 116 may not be present in the circuit 100. In various embodiments, the current source 116 may be replaced with a resistor or any other appropriate component.

In various embodiments, although the transistor T4 is illustrated to be a DFET, an HBT may be used instead for the transistor T4. If, for example, an HBT is used instead of a DFET for the transistor T4, due to a relatively large voltage drop (e.g., about 1.3 V) in the base-emitter junction of an HBT, the third switched supply voltage Vcc_3 may be substantially lower than the supply voltage Vcc while the transistor T4 is switched on. In various embodiments, in the case an HBT is used for transistor T4 (e.g., instead of a DFET), the diode 112 and/or the current source 116 may not be present in the circuit 100.

In various embodiments, the transistor T2 may be a DFET, although in other embodiments, the transistor T2 may be any other appropriate type of transistor. Using a DFET for the transistor T2 may have several advantages. For example, while the transistor T2 is switched on, the second switched supply voltage Vcc_2 may be substantially equal to the supply voltage Vcc if the transistor T2 is a DFET. This may be due to a relatively small voltage drop in the gate-source junction of the DFET transistor T2. However, if, for example, an HBT is used instead of a DFET for the transistor T2, due to a relatively large voltage drop (e.g., about 1.3 V) in the base-emitter junction of an HBT, the second switched supply voltage Vcc_2 may be substantially lower than the supply voltage Vcc while the transistor T2 is switched on. For example, if an HBT is used instead of a DFET for transistor T2, the second switched supply voltage Vcc_2 may be, for example, about 2 V for the supply voltage Vcc of about 3.3 V while the transistor T2 is switched on. As previously discussed, due to a relatively high voltage desired by the one or more components of the output stage 126, 2 V may not be a generally acceptable voltage level for the second switched supply voltage Vcc_2. Accordingly, an HBT may not be used for the transistor T2. Accordingly, a DFET may be used for the transistor T2.

In various embodiments, the transistor T1 may be an HBT, although in other embodiments, the transistor T1 may be any other appropriate type of transistor. Using an HBT for the transistor T1 may have several advantages. For example, while the transistor T1 is switched off, the first switched supply voltage Vcc_1 may be substantially equal to 0 V if the transistor T1 is an HBT, e.g., due to a positive pinch-off voltage of an HBT. However, if, for example, a DFET is used instead of an HBT for transistor T1, due to a negative pinch-off voltage (about −0.8 V) of a DFET, the first switched supply voltage Vcc_1 may be about 0.8 V even when the transistor T1 is switched off (e.g., when the control voltage Vc2 is in a logical low state). This may prevent the input stage 122 from turning off effectively. Accordingly, an HBT may be used for the transistor T1.

In various embodiments, as the transistor T2 is a DFET, when the transistor T2 is switched off, the second switched supply voltage Vcc_2 may have a non-zero value (e.g, about 0.8 V, due to, for example, the negative pinch-off voltage of the DFET transistor T2). The non-zero value of the second switched supply voltage Vcc_2 may generally be low enough to de-activate or turn off the one or more output signals, e.g., output_high, output_medium and output_low. However, the non-zero value of the second switched supply voltage Vcc_2 may induce a leakage current in the one or more components of the output stage 126 and/or may, in some situations, prevent one or components of the output stage 126 from effectively turning off. In various embodiments, to counter these effects of the transistor T2, the transistor T3 may be used to selectively ground the one or more components of the output stage 126.

During a first mode of operation (also referred to hereinafter as the first mode) of the circuit 100, for example, the control voltage Vc2 may be low. During the first mode, the transistor T1 may be turned off (as the control voltage Vc2 is low), which may result in the first switched supply voltage Vcc_1 being substantially equal to 0 V. Also, during the first mode, the transistor T2 may be turned off. However, due to the negative pinch-off voltage of the DFET transistor T2, during the first mode, the second switched supply voltage Vcc_2 may be slightly greater than 0 V (e.g., equal to about 0.8 V). Furthermore, during the first mode, the transistor T4 may be turned off, and the third switched supply voltage Vcc_3 may also be, for example, about 0.8 V (due to the negative pinch-off voltage of the transistor T4). However, the diode 112 may be selected and/or configured such that this voltage level of the third switched supply voltage Vcc_3 is not sufficient to turn on the diode 112. Accordingly, during the first mode, the output of the diode 112 may be low, which may result in the third control voltage Vc3 being low, thereby turning off the transistor T3.

As the transistor T3 is turned off, the one or more components of the output stage 126 may not be grounded. Accordingly, any possible effects of the second switched voltage Vcc_2 having a non-zero value (e.g., due to the negative pinch-off voltage of the transistor T2) or any possibilities of leakage current through the one or more components of the output stage 126 may be mitigated by the switched-off transistor T3. That is, during the first mode, even if the second switched voltage Vcc_2 has a non-zero value, the one or more components of the output stage 126 may be effectively turned off due to the switching off of the transistor T3.

During a second mode of operation (also referred to hereinafter as the second mode) of the circuit 100, for example, the control voltage Vc2 may be high. During the second mode, the transistor T1 may be switched on, thereby providing the first switched supply voltage Vcc_1 to the one or more components of the input stage 122 and/or the intermediate stage 124. During the second mode, the first switched supply voltage Vcc_1 may be lower than the supply voltage Vcc. This may be due to a voltage drop in the base-emitter junction of the HBT transistor T1. The first switched supply voltage Vcc_1 may be, for example, about 2 V for the supply voltage Vcc of about 3.3 V. However, this voltage level of the first switched supply voltage Vcc_1 may be sufficient to power and turn on the one or more components of the input stage 122 and/or the intermediate stage 124.

Also, during the second mode, the transistor T2 may be switched on, thereby providing the second switched supply voltage Vcc_2 to the one or more components of the output stage 126. During this mode, the second switched supply voltage Vcc_2 may be substantially same as the supply voltage Vcc. This may be due to a relatively low voltage drop in the gate-source junction of the DFET transistor T2. Also, during the second mode, the transistors T4 and T3 may be switched on, thereby effectively grounding the one or more components of the output stage 126.

Thus, during the second mode, all the stages of the logic circuit 120 are turned on and effectively powered by the first switched supply voltage Vcc_1 and/or the second switched supply voltage Vcc_2. Accordingly, the output signals of the logic circuit 120, during the second mode, are based at least in part on the mode signals V_mode1 and V_mode2.

In the case the logic circuit 120 is configured to control a power amplifier, or any other appropriate component, included in a computing device, e.g., a mobile telephone, a paging device, a personal digital assistant, a text-messaging device, a portable computer, and/or the like, the control voltages Vc1 and Vc2 may be associated with a power-saving mode of the computing device. The power-saving mode may be, e.g., a hibernation mode, a turn-off mode, a standby mode, etc. The power-saving mode may correspond to the previously discussed first mode of operation. For example, when the computing device enters the power-saving mode, the control voltages Vc1 and Vc2 may be low, thereby switching off the transistors T1 and T2. This may turn off the components of the logic circuit 120 and deactivate the output signals, thereby reducing a power consumed by the circuit 100 in the power saving mode.

On the other hand, a regular mode of operation of the circuit 100, e.g., when the computing device is transmitting and/or receiving wireless signals, may correspond to the previously discussed second mode of operation. During the regular mode of operation, the control voltages Vc1 and Vc2 may be high, thereby switching on the transistors T1 and T2 and turning on the various stages of the logic circuit 120. During the regular mode, the output signals may be based at least in part on the mode signals, as previously discussed.

Figure 2:
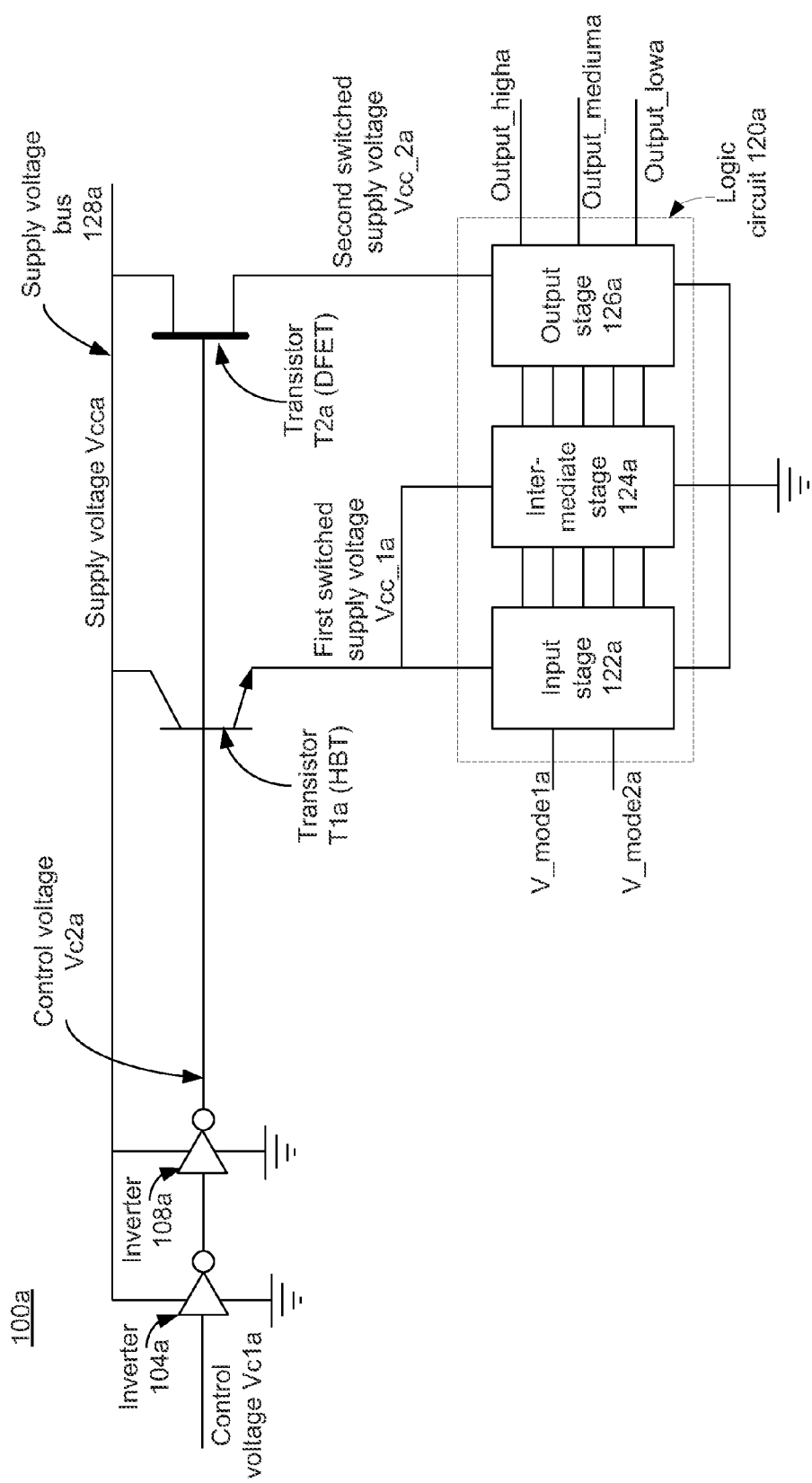

FIG. 2 schematically illustrates another circuit 100a in which a first switched supply voltage Vcc_1a and a second switched supply voltage Vcc_2a are used to power a logic circuit 120a, in accordance with various embodiments. One or more components and/or signals of the circuit 100a may be in part similar to respective components and/or signals of the circuit 100. For example, FIG. 2 illustrates a control voltage Vc1a, inverters 104a and 108a, control voltage Vc2a, supply voltage Vcca, transistor T1a, transistor T2a, input stage 122a, intermediate stage 124a, output stage 126a, mode signals V_mode1a and V_mode2a, and output signals output_higha, output_mediuma and output_lowa, which are at least in part similar to the corresponding components and/or signals of the circuit 100 of FIG. 1.

However, unlike the circuit 100 of FIG. 1, in the circuit 100a of FIG. 2, the one or more components of the input stage 122a and/or intermediate stage 124a are fixedly, i.e., non-selectively, grounded. That is, unlike the circuit 100 of FIG. 1, in the circuit 100a of FIG. 2, the transistor T4, diode 112, current source 116 and the transistor T3 are not present.

As illustrated in FIG. 2, the input stage 122a provides one or more signals to the intermediate stage 124a, and the intermediate stage 124a provides one or more signals to the output stage 126a.

During a third mode of operation (also referred to herein as the third mode) of the circuit 100a, for example, the control voltage Vc2a may be low. During the third mode, the transistor T1a may be turned off, which may result in the first switched supply voltage Vcc_1a to be substantially equal to 0 V.

Also, during the third mode, the transistor T2a may be turned off. Due to the negative pinch-off voltage of the transistor T2a, during the third mode, the second switched supply voltage Vcc_2a may be slightly greater than 0 V (e.g., equal to about 0.8 V), thereby providing a non-zero voltage to the one or more components of the output stage 126a during the third mode.

However, during the third mode, the input stage 122a and the intermediate stage 124a may be turned off (e.g., due to the turning off of the transistor T1a). Thus, during the third mode, the one or more signals from the input stage 122a to the intermediate stage 124a, and/or the one or more signals from the intermediate stage 124a to the output stage 126a may indicate a turned-off state of the logic circuit 120a. In various embodiments, due to the state of the one or more signals from the intermediate stage 124a to the output stage 126a, the one or more components of the output stage 126a may be effectively turned off, even if, for example, the second switched supply voltage Vcc_2a has a non-zero value. Thus, unlike the circuit 100, the one or more components of the output logic stage 126a may not be selectively grounded through an additional transistor T4.

During a fourth mode of operation (also referred to herein as the fourth mode) of the circuit 100a, for example, the control voltage Vc2a may be high. In various embodiments, the operation of the circuit 100a during the fourth mode may be at least in part similar to the operation of the circuit 100 of FIG. 1 during the second mode. Accordingly, a detailed discussed on the operation of the circuit 100a during the fourth mode is not provided herein.

Figure 3:
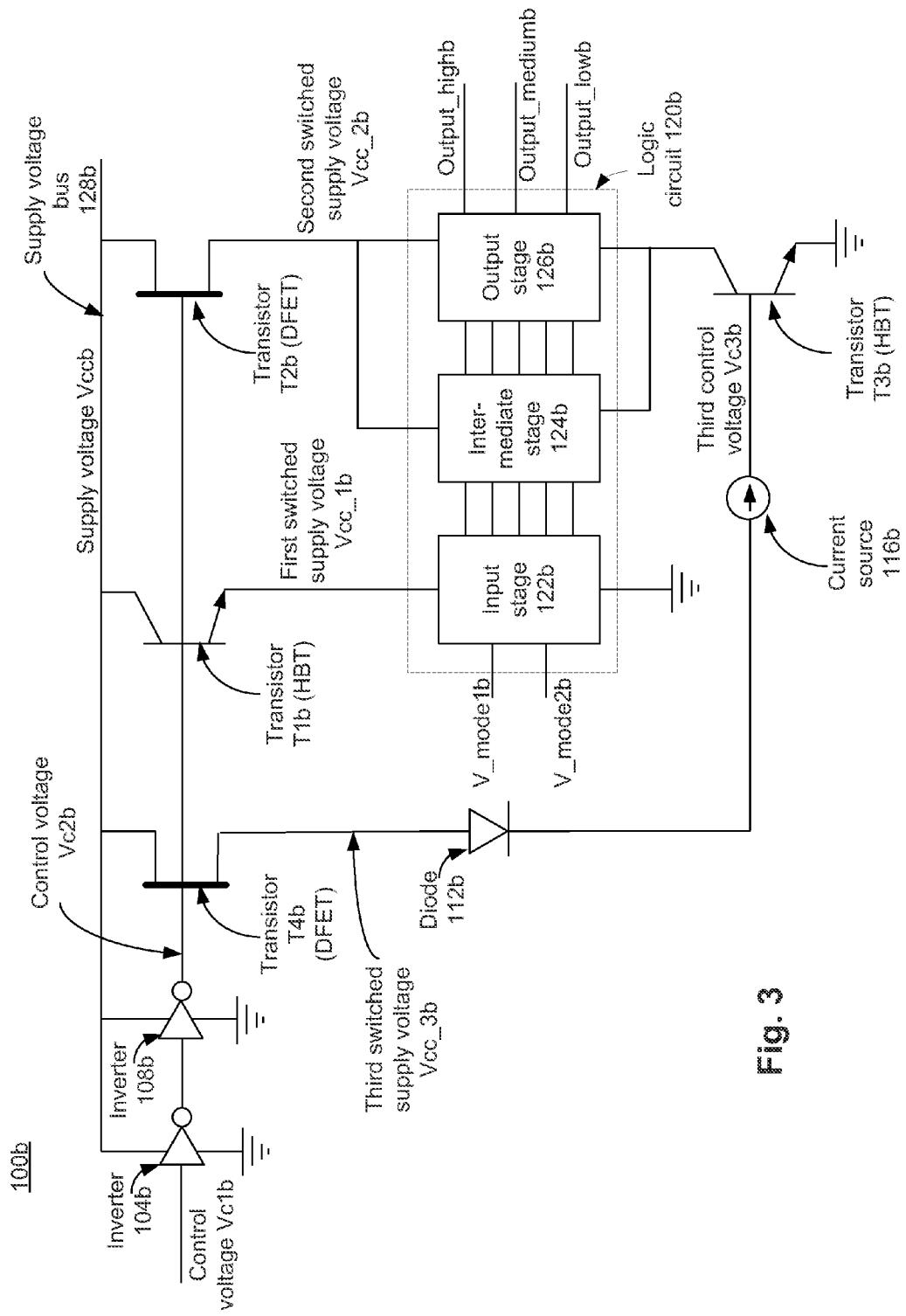

FIG. 3 schematically illustrates another circuit 100b in which a first switched supply voltage Vcc_1b and a second switched supply voltage Vcc_2b are used to power a logic circuit 120b, in accordance with various embodiments. One or more components and/or signals of the circuit 100b may be in part similar to respective components and/or signals of the circuit 100. For example, FIG. 3 illustrates a control voltage Vc1b, inverters 104b and 108b, control voltage Vc2b, supply voltage Vccb, transistor T1b, transistor T2b, transistor T3b, transistor T4b, diode 112b, current source 116b, input stage 122b, intermediate stage 124b, output stage 126b, mode signals V_mode1b and V_mode2b, and output signals output_highb, output_mediumb and output_lowb, which are at least in part similar to the corresponding components and/or signals of the circuit 100 of FIG. 1.

Referring again to FIG. 1, the intermediate stage 124 of the logic circuit 120 is illustrated to receive the first switched supply voltage Vcc_1. However, in various other embodiments and as illustrated in FIG. 3, the intermediate stage 124b of the logic circuit 120b may be powered by the second switched voltage Vcc_2b, e.g., instead of the first switched voltage Vcc_1b, and one or more components of the intermediate stage 124b of the logic circuit 120b may be selectively grounded through the transistor T3.

Figure 4:
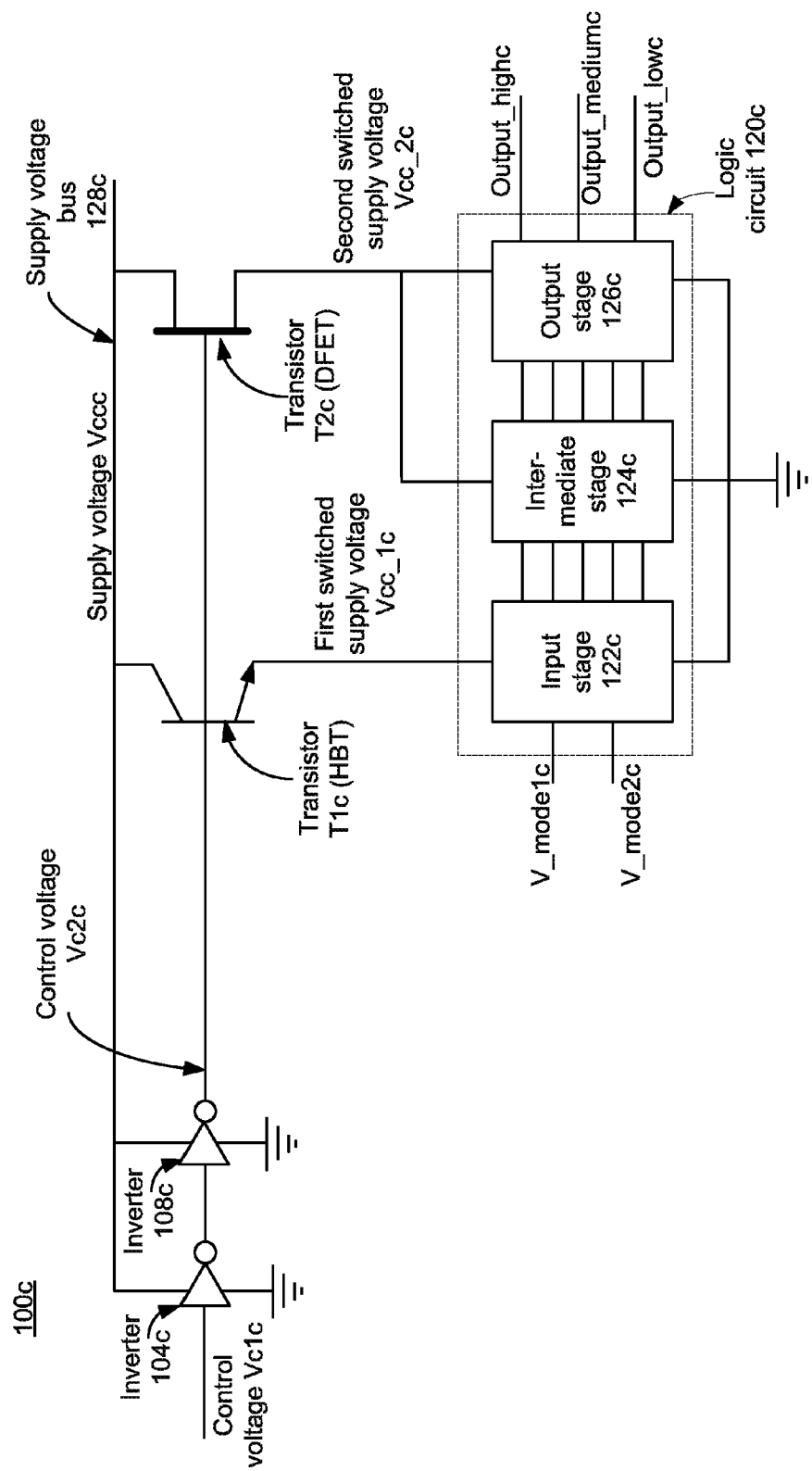

FIG. 4 schematically illustrates another circuit 100c in which a first switched supply voltage Vcc_1c and a second switched supply voltage Vcc_2c are used to power a logic circuit 120c, in accordance with various embodiments. One or more components and/or signals of the circuit 100c may be in part similar to respective components and/or signals of the circuit 100. For example, FIG. 4 illustrates a control voltage Vc1c, inverters 104c and 108c, control voltage Vc2c, supply voltage Vccc, transistor T1c, transistor T2c, input stage 122c, intermediate stage 124c, output stage 126c, mode signals V_mode1c and V_mode2c, and output signals output_highc, output_mediumc and output_lowc, which are at least in part similar to the corresponding components and/or signals of the circuit 100a of FIG. 2.

Referring again to FIG. 2, the intermediate stage 124a of the logic circuit 120a is illustrated to receive the first switched supply voltage Vcc_1a. However, in various other embodiments and as illustrated in FIG. 4, the intermediate stage 124c of the logic circuit 120c may be powered by the second switched voltage Vcc_2c, e.g., instead of the first switched voltage Vcc_1c.

In FIG. 4, during a fifth mode of operation (also referred to herein as the fifth mode) of the circuit 100c, for example, the control voltage Vc2c may be low. During the fifth mode, the input stage 122c may be turned off (e.g., due to the turning off of the transistor T1c). Thus, during the fifth mode, the one or more signals from the input stage 122c to the intermediate stage 124c may indicate a turned-off state of the logic circuit 120c. In various embodiments, due to the state of the one or more signals from the input stage 122c to the intermediate stage 124c, the one or more components of the intermediate stage 124c may be effectively turned off (although, for example, there may be some leakage current in one or more components of the intermediate stage 124c), even if, for example, the second switched supply voltage Vcc_2c has a non-zero value. For similar reasons, the one or more components of the output stage 126c may also be effectively turned off.

In various embodiments, a mode of operation of the circuit 100c, corresponding to the control voltage Vc2c being high, may be at least in part similar to the previously discussed fourth mode of operation of the circuit 100a. Accordingly, the mode of operation of the circuit 100c, with the high control voltage Vc2c, is not discussed herein in further detail.

The process of co-integrating various transistors (e.g., HBTs, FETs, etc.) is sometimes known in the art as a bipolar-high electron mobility transistor (BiHEMT) process and/or as bipolar field effect transistor (BiFET) process. In various embodiments, one or more components of the circuits 100, 100a, 100b and/or 100c may be co-integrated using a BiHEMT process, a BiFET process, and any other appropriate process (e.g., a process that involves co-integrating HBT and FET on two different substrates, but possibly in one package). In various embodiments, one or more components of the circuits 100, 100a, 100b and/or 100c may be formed on gallium arsenide (GaAs) substrates. For example, one or more transistors (e.g., transistor T1 and T2 of circuit 100) and/or one or more other components of the circuits 100, 100a, 100b and/or 100c may be formed on GaAs substrates.

In a conventional BiHEMT circuit, an EFET is generally used to power an associated logic circuit. However, integrating EFET in a BiHEMT process may, in some applications, have a relatively higher cost implication. In the embodiments of FIGS. 1-4, instead of an EFET, an HBT and a DFET are used to power the logic circuit, thereby saving cost of fabricating the circuit, without adversely affecting the performance of the circuit. In various embodiments, the circuit 100, 100a, 100b and/or 100c, including the associated logic circuit, may not include any EFET.

Figure 5:
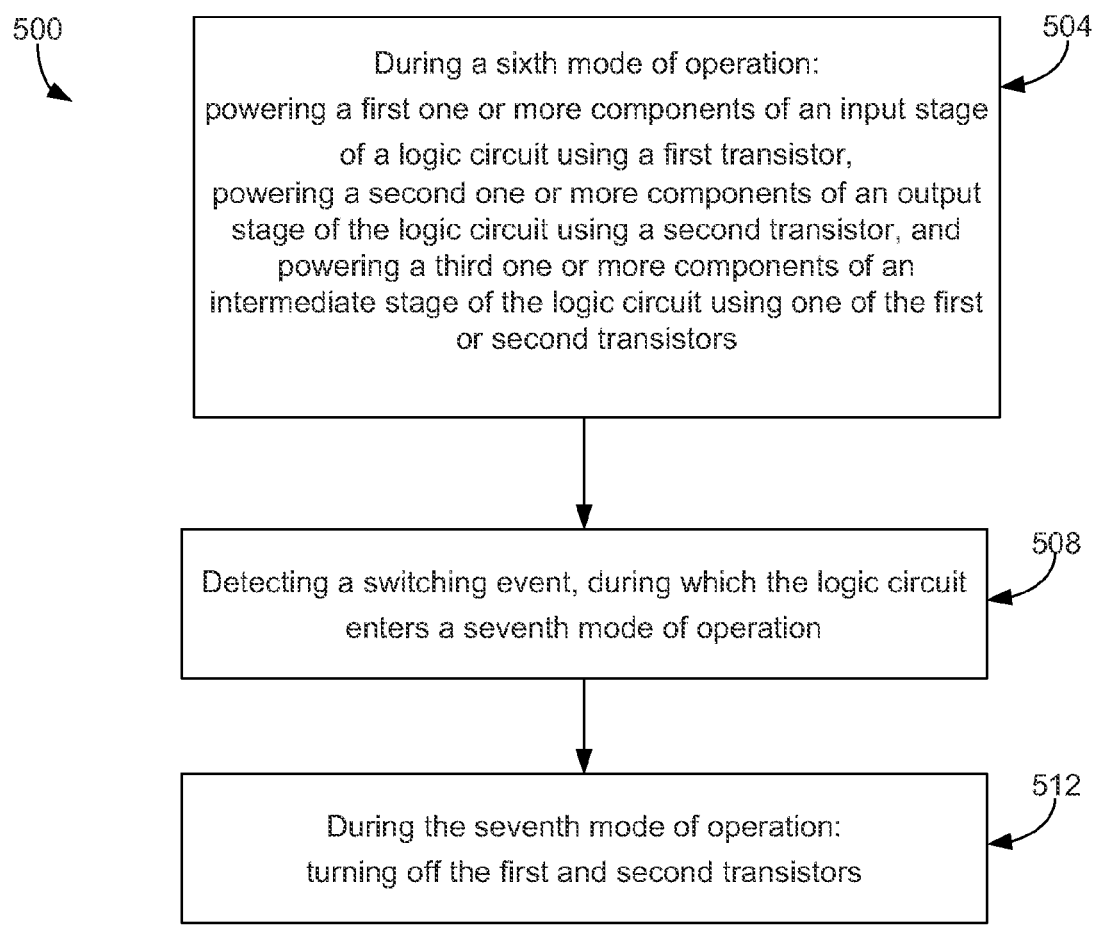
FIG. 5 is a flowchart illustrating operation of a logic circuit, in accordance with various embodiments.

FIG. 5 is a flowchart 500 illustrating operation of a logic circuit (e.g., logic circuits 120, 120a, 120b and/or 120c), in accordance with various embodiments. At block 504, the operations may be associated with a sixth mode of operation, and may include powering a first one or more components of an input stage (e.g., input stages 122, 122a, 122b and/or 122c) of the logic circuit using a first transistor, powering a second one or more components of an output stage (e.g., output stages 126, 126a, 126b and/or 126c) of the logic circuit using a second transistor, and powering a third one or more components of an intermediate stage (e.g., intermediate stages 124 or 124a) of the logic circuit using one of the first or second transistors.

During the sixth mode of operation, for example, a control voltage (e.g., control voltages Vc2, Vc2a, Vc2b and/or Vc2c), controlling the first and second transistors, may be high. The first transistor may be, for example, an HBT transistor, e.g., transistors T1, T1a, T1b and/or T1c. The second transistor may be, for example, a DFET transistor, e.g., transistors T2, T2a, T2b and/or T2c.

In various embodiments, the first transistor may provide a first switched supply voltage to power the first one or more components, and the second transistor may provide a second switched supply voltage to power the second one or more components. In various embodiments, a first terminal of the first transistor may receive a supply voltage (e.g., supply voltages Vcc, Vcca, Vccb and/or Vccc), a control terminal of the first transistor may receive the control voltage, and a second terminal of the first transistor may provide the first switched supply voltage. In various embodiments, a first terminal of the second transistor may receive the supply voltage, a control terminal of the second transistor may receive the control voltage, and a second terminal of the second transistor may provide the second switched supply voltage.

In various embodiments, during the sixth mode of operation, the input stage and the output stage may be turned on, and the second switched supply voltage may be substantially higher than the first switched supply voltage. In various embodiments, the third one or more components of the intermediate stage may be powered by one of the first switched supply voltage and the second switched supply voltage. In various embodiments, the second one or more components may be selectively grounded using a third transistor (e.g., transistor T3), while the first one or more components may be fixedly grounded, e.g., as illustrated in FIGS. 1 and 3. In various other embodiments, the first one or more components and the second one or more components may be fixedly grounded, e.g., as illustrated in FIGS. 2 and 4.

Referring again to FIG. 5, the method 500 may further include, at 508, detecting a switching event, during which the logic circuit enters a seventh mode of operation. For example, a change in the control voltage, from high to low, may be indicative of the logic circuit entering the seventh mode of operation.

Referring again to FIG. 5, the method 500 may further include, at 512, while operating in the seventh mode of operation, turning off the first transistor and the second transistor. As previously explained, turning off the first transistor may result in turning off of the first one or more components of the input stage, and turning off the second transistor may result in turning off of the second one or more components of the output stage.

Figure 6:
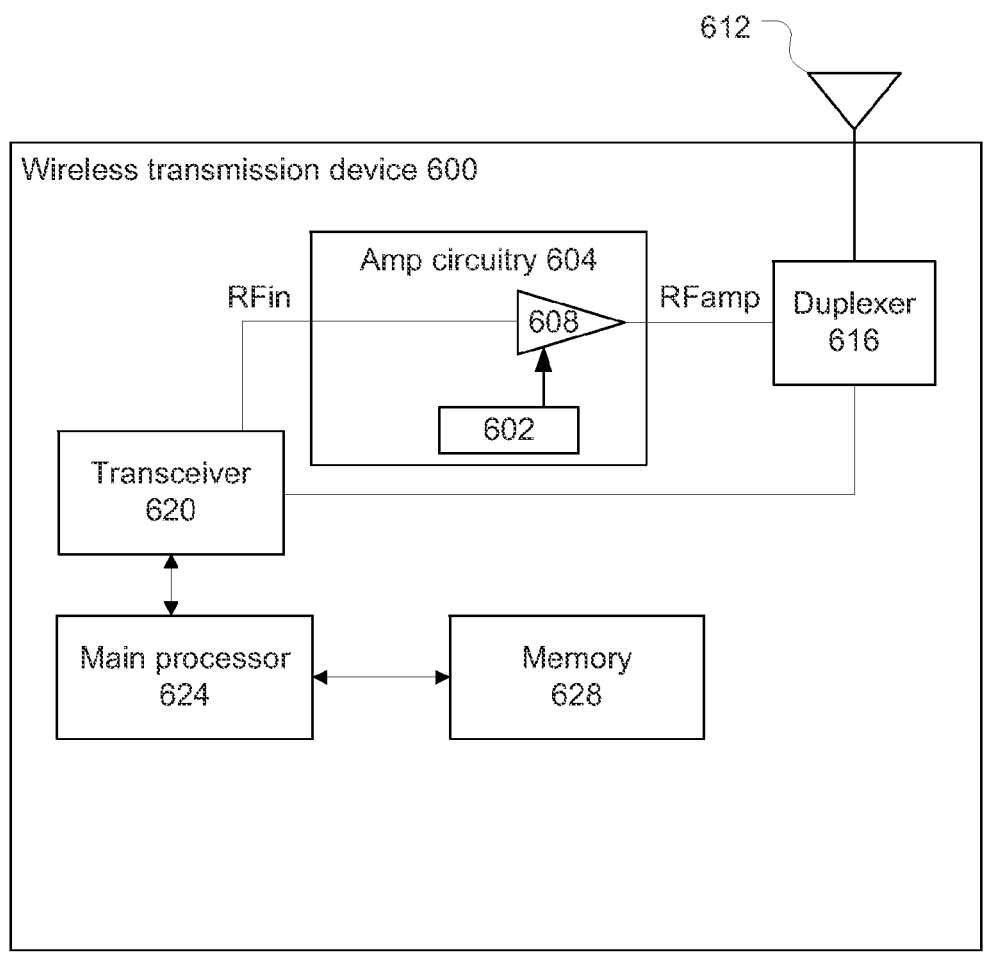
FIG. 6 is a wireless transmission device incorporating one of the circuits of FIGS. 1-4, in accordance with various embodiments.

The circuits 100, 100a, 100b, and 100c may be incorporated into any of a variety of apparatuses and systems. A block diagram of an exemplary wireless transmission device 600 incorporating one of the circuits 100, 100a, 100b, and/or 100c (represented as circuit 602) into amplification circuitry 604 that includes a power amplifier 608 is illustrated in FIG. 6. In various embodiments, the circuit 602 may be configured to control operations of the power amplifier 608. Although not illustrated in FIG. 6, the circuit 602 may include a logic circuit having an input stage and an output stage, an HBT operatively coupled with the input stage and configured to provide a first switched supply voltage to power a first one or more components of the input stage, and a DFET operatively coupled with the output stage and configured to provide a second switched supply voltage to power a second one or more components of the output stage.

In addition to the amplification circuitry 604, the wireless transmission device 600 may have an antenna structure 612, a duplexer 616, a transceiver 620, a main processor 624, and a memory 628 coupled with each other at least as shown. While the wireless transmission device 600 is shown with transmitting and receiving capabilities, other embodiments may include wireless transmission devices without receiving capabilities.

In various embodiments, the wireless transmission device 600 may be, but is not limited to, a mobile telephone, a paging device, a personal digital assistant, a textmessaging device, a portable computer, a desktop computer, a telecommunications base station, a subscriber station, an access point, a radar, a satellite communication device, or any other device capable of wirelessly transmitting RF signals.

The main processor 624 may execute a basic operating system program, stored in the memory 628, in order to control the overall operation of the wireless transmission device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the main processor 624, may generate the RFin signal to represent the outgoing data, and provide the RFin signal to the amplification circuitry 604.

The amplification circuitry 604 may amplify the RFin signal in accordance with a selected amplification mode. The amplified RFamp signal may be forwarded to the duplexer 616 and then to the antenna structure 612 for an over-the-air (OTA) transmission.

In a similar manner, the transceiver 620 may receive an incoming OTA signal from the antenna structure 612 through the duplexer 616. The transceiver 620 may process and send the incoming signal to the main processor 624 for further processing.

In various embodiments, the antenna structure 612 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A circuit comprising:
a logic circuit having an input stage and an output stage; and
a plurality of transistors coupled with and configured to power the logic circuit, wherein the plurality of transistors does not include an enhancement mode field effect transistor (EFET) and does include:
a heterojunction bipolar transistor (HBT) coupled with the input stage and configured to provide a first switched supply voltage to power a first one or more components of the input stage; and
a depletion mode field effect transistor (DFET) coupled with the output stage and configured to provide a second switched supply voltage to power a second one or more components of the output stage;
wherein during a first mode of operation, the HBT and the DFET are turned on, and the second switched supply voltage is substantially higher than the first switched supply voltage.

2. The circuit of claim 1, wherein the HBT includes:
a first terminal configured to receive a supply voltage;
a control terminal configured to receive a control voltage; and
a second terminal configured to provide the first switched supply voltage.

3. The circuit of claim 1, wherein the DFET includes:
a first terminal configured to receive a supply voltage;
a control terminal configured to receive a control voltage; and
a second terminal configured to provide the second switched supply voltage.

4. The circuit of claim 1, wherein the logic circuit includes an intermediate stage, wherein a third one or more components of the intermediate stage are to be powered by the first switched supply voltage.

5. The circuit of claim 1, wherein the logic circuit includes an intermediate stage, wherein a third one or more components of the intermediate stage are to be powered by the second switched supply voltage.

6. The circuit of claim 1, wherein the HBT is a first HBT and the circuit further comprises:
a second HBT configured to selectively ground the second one or more components.

7. The circuit of claim 6, wherein the logic circuit includes an intermediate stage, wherein a third one or more components of the intermediate stage are to be selectively grounded by the second HBT.

8. The circuit of claim 6, wherein the first one or more components are fixedly grounded.

9. A circuit comprising:
a logic circuit having an input stage and an output stage;
a first heterojunction bipolar transistor (HBT) coupled with the input stage and configured to provide a first switched supply voltage to power a first one or more components of the input stage;
a depletion mode field effect transistor (DFET) coupled with the output stage and configured to provide a second switched supply voltage to power a second one or more components of the output stage;
a second HBT configured to selectively ground the second one or more components;
a transistor having:
a first terminal configured to receive a supply voltage;
a control terminal configured to receive a control voltage; and
a second terminal configured to provide a third switched supply voltage; and
a diode configured to receive the third switched supply voltage, wherein an output of the diode is configured to control the second HBT.

10. The circuit of claim 1, wherein the first one or more components and the second one or more components are fixedly grounded.

11. The circuit of claim 1, wherein at least a part of the circuit is fabricated using a bipolar-high electron mobility transistor (BiHEMT) process.

12. A system comprising:
a power amplifier;
a logic circuit configured to control the power amplifier, the logic circuit having an input stage and an output stage;
a plurality of transistors coupled with and configured to power the logic circuit, wherein the plurality of transistors does not include an enhancement mode field effect transistor and does include a heterojunction bipolar transistor (HBT) configured to provide a first switched supply voltage to power a first one or more components of the input stage; and
a depletion mode field effect transistor (DFET) configured to provide a second switched supply voltage to power a second one or more components of the output stage;
wherein during a first mode of operation, the HBT and the DFET are turned on, and the second switched supply voltage is substantially higher than the first switched supply voltage.

13. The circuit of claim 12, wherein during the first mode of operation, the first one or more components are fixedly grounded, and the second one or more components are grounded through another transistor.

* * * * *